United States Patent
Stimson

(10) Patent No.: US 7,487,422 B2
(45) Date of Patent: Feb. 3, 2009

(54) DELAYED PROCESSING OF SITE-AWARE OBJECTS

(75) Inventor: Randall B. Stimson, Boston, MA (US)

(73) Assignee: Teradyne, Inc., North Reading, MA (US)

( * ) Notice: Subject to any disclaimer, the term of this patent is extended or adjusted under 35 U.S.C. 154(b) by 561 days.

(21) Appl. No.: 11/184,579

(22) Filed: Jul. 19, 2005

(65) Prior Publication Data

US 2006/0248425 A1 Nov. 2, 2006

Related U.S. Application Data

(60) Provisional application No. 60/676,003, filed on Apr. 29, 2005.

(51) Int. Cl.
  *G01R 31/28* (2006.01)
  *G06F 11/00* (2006.01)
(52) U.S. Cl. ..................... 714/741; 717/136
(58) Field of Classification Search ............... 714/741; 703/13–22; 324/765, 158.1; 717/136
  See application file for complete search history.

(56) References Cited

U.S. PATENT DOCUMENTS

| | | | |
|---|---|---|---|
| 5,845,234 A | 12/1998 | Testa et al. | |
| 6,941,232 B2 | 9/2005 | Burke et al. | |
| 7,253,607 B2 | 8/2007 | Hlotyak et al. | |
| 7,254,508 B2 | 8/2007 | Hlotyak | |
| 2004/0225465 A1 | 11/2004 | Pramanick et al. | |
| 2005/0154551 A1 | 7/2005 | Pramanick et al. | |
| 2005/0261856 A1 | 11/2005 | Kushnick et al. | |

OTHER PUBLICATIONS

International Search Report for Application No. PCT/US06/13546, dated Apr. 12, 2006.
Written Opinion for Application No. PCT/US06/13546, dated Apr. 12, 2006.
Action and Response History retrieved from PAIR for U.S. Appl. No. 11/192,927, retrieved Jun. 30, 2008.
Action and Response History retrieved from PAIR for U.S. Appl. No. 11/231,722, retrieved Jun. 30, 2008.
International Search Report & Written Opinion in Application No. PCT/US06/13546, dated Jul. 3, 2006.
Int'l Preliminary Report on Patentability in Application No. PCT/US06/13546, dated May 25, 2007.

*Primary Examiner*—Guy J Lamarre
(74) *Attorney, Agent, or Firm*—Fish & Richardson P.C.

(57) ABSTRACT

A device is tested using a system that includes automatic test equipment (ATE) and a computer. At the ATE, the testing includes receiving data from the device, and processing the data to obtain processed data. At the computer, the testing includes executing a computer program while the data is being processed at the ATE, where the computer program processes an object that contains a pointer, passing the object to the ATE, and receiving the object from the ATE. The pointer in the object is replaced with the processed data.

20 Claims, 5 Drawing Sheets

DELAYED PROCESSING OF SITE-AWARE OBJECTS

CLAIM TO PRIORITY

This patent application claims priority to U.S. Provisional Application No. 60/676,003, filed on Apr. 29, 2005, the contents of which are hereby incorporated by reference into this application as if set forth herein in full.

TECHNICAL FIELD

This patent application relates generally to automatic test equipment (ATE) and, more particularly, to delaying processing of objects containing ATE test data.

BACKGROUND

ATE refers to an automated, usually computer-driven, approach to testing devices, such as semiconductors, electronic circuits, and printed circuit board assemblies. A device tested by ATE, such as a semiconductor device, is referred to as a device under test (DUT).

A test system may include ATE and a host computer. Data from a DUT may be preliminarily processed in the ATE, and then passed to the host computer for subsequent processing. The processing that occurs in the ATE and in the host computer is typically asynchronous, meaning that there is not significant timing coordination between the two. As a result, interaction between the ATE and the host computer as may occur, e.g., when exchanging data, can slow down the testing process significantly. For example, if the host computer requests processed data from the ATE, the host computer may have to wait for the ATE to process the data. During the time that the host computer waits, the host computer may remain idle. This is typically because the host computer requires the processed data in order to proceed with its logical flow. As a result of this waiting by the host computer, overall testing time is increased.

SUMMARY

This application describes apparatus and methods, including computer program products, for implementing delayed processing of site-aware objects.

In general, in one aspect, the invention is directed to a method of testing a device using a system comprised of automatic test equipment (ATE) and a computer. At the ATE, the method includes receiving data from the device and processing the data to obtain processed data. At the computer, the method includes executing a computer program while the data is being processed at the ATE, where the computer program processes an object that contains a pointer, passing the object to the ATE, and receiving the object from the ATE. The pointer in the object is replaced with the processed data.

The foregoing aspect may also include one or more of the following features.

The ATE may receive the object and may replace the pointer in the object with the processed data. Replacing the object may include binding the object to the processed data. The computer program may be configured not to pass the object to the ATE until the computer program requires the processed data. At the computer, the method may also include determining whether the processed data falls within an acceptable range of test limits. The pointer may point to a storage location associated with the processed data.

The processed data may be stored in a data structure in the object. The method may also include copying the data structure to a different object and replacing the data structure with a different data structure. The object may be for use with the plural sites, and may contain data associated with at least some of the plural sites. The object may also be used to keep track of which sites are active.

In general, in another aspect, the invention is directed to one or more machine-readable media that store executable instructions to receive data from a device under test, to process the data to obtain processed data, to execute a computer program while the data is being processed, where the computer program processes an object that contains a pointer, and to replace the pointer in the object with the processed data only after the computer program reaches a point where the computer program requires the processed data.

The foregoing aspect may also include instructions to implement one or more of the features described above with respect to the first aspect.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

ATEs that supports multi-site testing include slots, or "sites". A device to be tested inserts into each site, and the ATE performs tests on the device in the site. Computer programs are typically involved in the testing. The ability to test devices at multiple sites without changing code in these computer programs is referred to as "site transparency". In more detail, site transparency refers to automatic management of sites and site data such that users have little responsibility for such tasks, and barely need consider the fact that their testing is multi-site until required to do so. If effective, users will not be continuously conscious of the site dimensionality of their programming.

Figure 1:
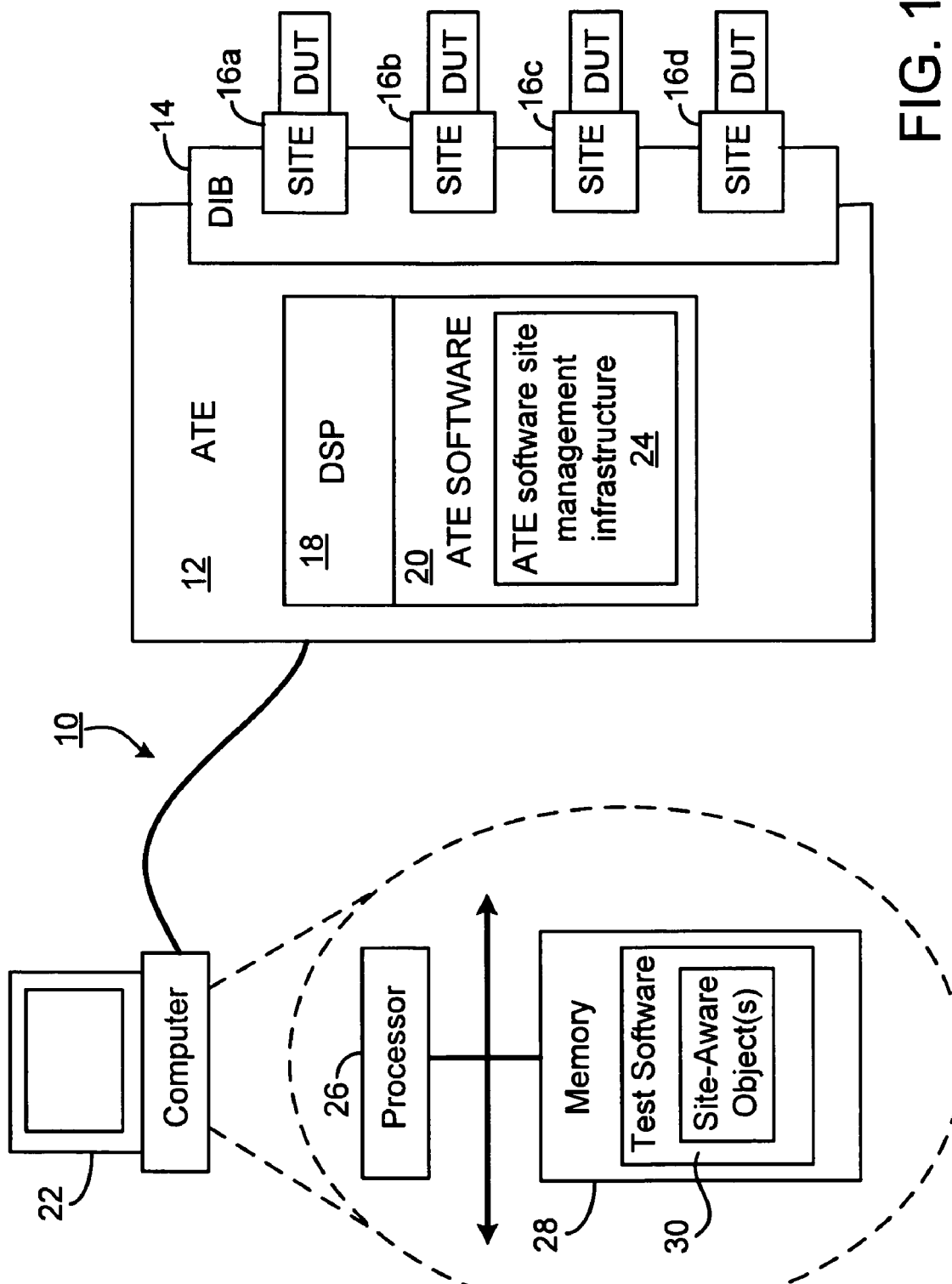
FIG. 1 is a block diagram of an ATE system.

FIG. 1 shows a system 10 for use in testing multiple DUTs. System 10 includes an ATE 12. ATE 12 includes a device interface board (DIB) 14, that is used to connect devices to the ATE. DIB 14 has multiple sites 16a to 16d. A DUT may be inserted into each site for testing using the ATE. Although only four sites are shown in FIG. 1, ATE 12 may include any number of sites. Also, in the example of FIG. 1, there is one DUT per slot, however, it is not a requirement that all the sites be occupied.

Each DUT may be any type of device that can be tested using an ATE, examples of which include, but are not limited to, semiconductor devices and electronic assemblies.

ATE 12 includes an internal processing device, such as digital signal processor (DSP) 18. DSP 18 may execute all or part of ATE software 20, i.e., computer program(s) comprised of executable code, to test the DUTs in sites 16a to 16d. ATE software 20 may be stored in memory (not shown) on ATE 12, or may be provided from an external processing device, such as computer 22 described below. ATE software 20 includes an ATE software site management infrastructure 24 that manages sites 16a to 16d.

Among other things, the ATE software site management infrastructure controls the exchange of information between ATE software 20 and sites 16a to 16d. This information can include data from a DUT in a site and/or data to be sent to a DUT in a site. Examples of data to the DUT include, but are not limited to, test data such as waveforms or other stimuli, and configuration data that is used by ATE software 20 to program the DUT (it is noted that, in one embodiment, the DSP only processes signals from the DUT). Examples of the data from a DUT include, but are not limited to, an indication as to whether a site is active or not, and readings from a DUT in the site, including readings from individual pins in the DUT. It is noted that a site may be deemed inactive if that site has binned-out, meaning that the DUT in the site has completed and passed all necessary tests or that the DUT has failed one or more necessary tests. In either case, no further testing is done. Alternatively, a site may be deemed inactive if there is no DUT in the site or if the site has been designated inactive by an administrator running the tests.

ATE software 20 also may include code to perform processing on data received from ATE 12 (or on data going to ATE 12). For example, ATE software 20 may include code to extract and process digital waveforms corresponding to test results and/or data received from a DUT. The ability to perform processing on ATE 12 increases the overall efficiency and speed of test system 10, since it allows high-speed DSP(s) to be used for signal processing and distributes processing across different devices. This arrangement, however, can have the drawbacks noted in the Background section, particularly if the DSP(s) and the processor on computer operate asynchronously. The processes described herein, however, address those drawbacks, as explained below.

ATE 12 is in communication with computer 22. Computer 22 may be any type of processing device including, but not limited to, a conventional personal computer (PC), a desktop device or a hand-held device, a multiprocessor computer, a microprocessor-based or programmable consumer electronics device, a mini-computer, a mainframe computer, and/or a personal mobile computing device. In the example of FIG. 1, computer 22 contains one or more processors, referred to simply as "processor 26", and memory 28. Memory 28 stores test software 30 that is executed by processor 26 to test DUTs in ATE 12. During testing, test software 30 interacts with ATE software 20, including the ATE software site management infrastructure described above. For example, test software 30 may control testing by instructing ATE software 20 to provide test data to DUTs at sites 16a to 16d, and to report the results of such tests back to test software 30 or to a designated subsystem. To this end, test software 30 may generate one or more graphical user interfaces (GUIs) (not shown), through which an administrator may control testing on ATE 12.

Heretofore, test software on computer 22 operated in conjunction with an interactive graphical environment called the procedural development environment (PDE). The PDE contained code to implement site transparency, thereby allowing test software developers to focus on process flow. Resulting test software was thus dependent upon the PDE. System 10, however, need not include the PDE. Instead, test software 30 makes use of site-aware objects (described below) to implement site transparency during testing.

In this embodiment, test software 30 is written in Visual Basic for Applications (Visual Basic). Visual Basic is a high level programming language that evolved from an earlier DOS version called Basic. Visual Basic is a visual and events-driven programming language. This is its main divergence from the earlier Basic. In Basic, programming is performed in a text-only environment and programs are executed sequentially. In Visual Basic, programming is performed in a graphical environment using objects.

An object is a self-contained entity that contains both data and code that is executed to manipulate the data. Because users may select objects randomly in Visual Basic, each object is programmed independently to be able to respond to such actions. A Visual Basic program thus may be made up of numerous subprograms, each of which has its own program code, and each of which can be executed independently and at the same time as other subprograms.

The site-aware objects used by ATE 12 are data objects that are designed to represent multi-site data. Such data might be used to program ATE instruments, hold measured readings, manipulate those readings, and/or report those readings to subsystems responsible for dispositioning a DUT (e.g., binning) and recording test results (datalog). Site-aware objects take their name from the fact that they are internally connected to ATE software site management infrastructure 24 and are, therefore, aware of changes to the ATE's system site context over time, e.g., periodic changes detected every hour, minute, second, etc. Site-aware objects present two seemingly conflicting models to a user. Site-aware objects allow the user to write test code while essentially ignoring the concept of sites, while allowing users to access site-specific data when needed.

Figure 2:
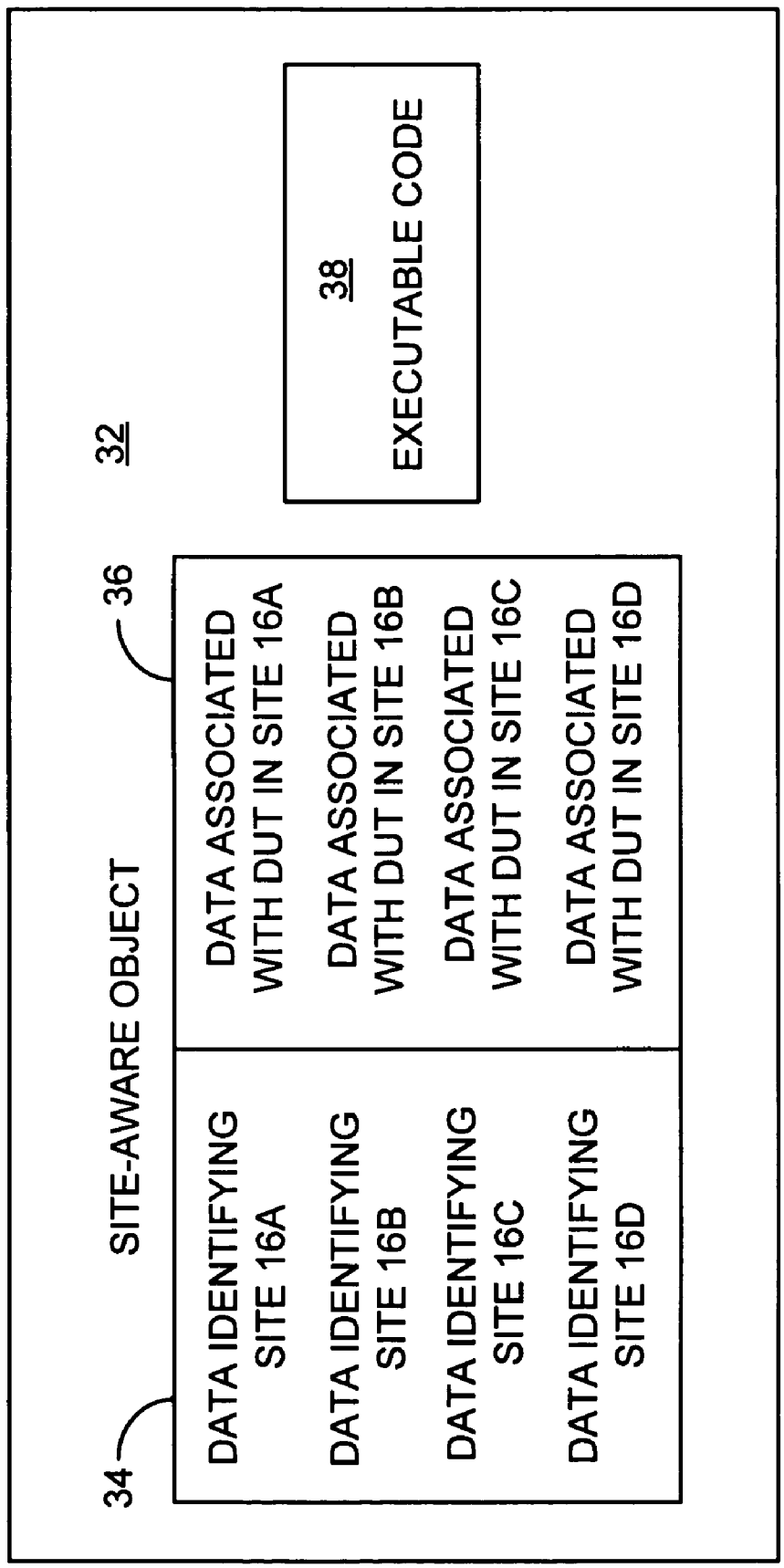
FIG. 2 is a diagram of a site-aware object.

Referring to FIG. 2, in this embodiment, a site-aware object 32 contains data 34 identifying each of sites 16a to 16d on DIB 14. Site-aware object 34 also contains data 36 associated with a DUT at each of the sites. The data associated with the DUTs may be data received from a DUT, such as readings, test results, or the like; or data to transfer to a DUT, such as program information, test data, or the like.

Site-aware object 32 is similar to an array in the sense that site aware object 32 correlates sites to data associated with DUTs in those sites. Site-aware object 32 is different from an array, however, in that site-aware object 32 knows which sites are active/inactive during testing. To this end, site-aware object 32 also contains executable code 38 that is used to communicate with ATE software site management infrastructure 24 in order to determine which sites 16a to 16d are active/inactive, to update its stored data accordingly, and to communicate with test software 30.

In this embodiment, site-aware objects are used in Visual Basic. It is noted, however, that site-aware objects are not limited to use in a Visual Basic context; they may be implemented in any programming language. The following description, however, applies to site-aware objects that are used with Visual Basic.

In Visual Basic, the most general-purpose variable type is the Variant. This variable type is designed to hold any other variable type that can be used in a Visual Basic programming environment. In this embodiment, a site-aware equivalent to the Variant, called the SiteVariant, is defined. The SiteVariant can hold any type of multi-site values.

The behavior of the SiteVariant object can be summarized as follows. A SiteVariant object contains data for multiple sites. The data can be site-uniform, if assigned a single scalar value in a single assignment statement, or site-specific, if returned by a measurement. A SiteVariant object is "site-aware." When used, it knows whether the test program is currently in a site loop, in which only one site is currently selected. A SiteVariant object can be used like any other Visual Basic scalar when it is in a site loop (and a single site is selected) or when it is site-uniform (and it has a single scalar value for all sites). Otherwise, when it is outside a site loop and holds site-specific data, it is treated as multisite. The following code demonstrates the dual functionality of Site Variants depending on whether they hold multisite data, and whether they are used inside or outside a site loop. The use of Debug.Print in the following example is a proxy for any usage that requires a single scalar variable. In this example, a double-letter variable name like YY denotes that it holds multisite data. Single-letter variable names like X hold a scalar, and act just like a standard Visual Basic Double in this example.

```
Dim Site As Variant
Dim X As New SiteDouble
Dim YY As New Site Double
X=2.5 'Variable holds one number -- same number for all
    sites
Debug.Print X 'Prints 2.5
YY=thehdw.DCFI.Pins("Vdd").Meter.Read 'Meter Read
    returns site-specific data
    -- a separate value for each site.
Debug.Print YY 'Runtime Error: "Object contains site-
    specific data"
For each Site In theExec.Sites
    Debug.Print Site
    Debug.Print YY 'Works here. Object always evaluates
        to a scalar in a site loop
Next Site.
```

A SiteVariant is either site-uniform or site-specific. "Site-uniform" means that all sites share one common value from a single assignment. "Site-specific" means that each site has its own value. Note that these terms refer to sharing a single value, not to the numeric equivalence of the values. For example, if a site loop assigned 5.0 to all sites in a SiteDouble, it would still be site-specific even though all sites had the same value.

More specific object types may be derived from SiteVariant to hold specific Visual Basic variable types. These object types may correspond to variable types that are native to Visual Basic. Examples of these more specific object types include SiteDouble, SiteBoolean, SiteLong, and PinData. The object types SiteDouble, SiteBoolean, and SiteLong represent SiteVariant data that corresponds, respectively, to native Visual Basic types Double (64-bit precision floating-point numbers), Boolean (logical true or false), and Long (32-bit integer). PinData extends SiteVariant to include device-pin-related properties such as a pin name and channel identifier. PinData is used in a PinListData collection class which encapsulates multi-pin, multi-site instrument readings. That is, PinListData identifies individual pins of a DUT and data values associated with measurements for each of those individual pins for multiple sites and active sites.

More specifically, the PinListData object has been integrated into the new SiteVariant use model. The PinListData object adds a pin dimension to multisite data. As such, it can be considered a matrix containing data for each Pin and Site. It holds PinData objects, one for each pin. Each pin slice of a PinListData is a SiteVariant with a pin name. It is called a PinData object. In fact, any PinListData object that contains a single pin can be used as a SiteVariant, or as one of its more specific derivatives if the data type held matches the derivative's data type. For this reason, users no longer need to use PinListData objects if their driver syntax contains a single pin. For example, users have the option of putting a single-pin measurement directly into a SiteDouble. The PinListData object, because it holds SiteVariants, has the same site-aware behavior and same site-uniform/site-specific attributes. While PinListData legacy syntax will still function, much of the syntax is being hidden in favor of an interface that is consistent with the SiteVariant model. PinListData math methods are provided to perform math on multiple sites and multiple pins with a single call. The following code takes meter measurements on three pairs of pins on four sites, then datalogs the delta between all pairs on all sites with a single statement:

```
Dim HighReading As New PinListData
Dim LowReading As New PinList Data
Dim Delta As New PinListData
HighReading=thehdw.DCVI.Pins("A_pos, B_pos, C_
    pos").Meter.Read
LosReading=thehdw.DVCI.Pins("A_neg, B_neg, C_
    neg").Meter Read
Delta=HighReading.Subtract(LowReading)
TheExec.Flow.TestLimit Delta
```

The foregoing object types are not the only types that can be derived. Any type that may appear in a Variant can form the basis for a derivation of SiteVariant. These types may include, but are not limited to, user defined types and non-native Visual Basic types.

Site-aware objects mimic, to the extent possible, the behavior of their counterpart Visual Basic types. As such, the programming model for SiteVariant is nearly the same as the programming model for Variant, SiteDouble for Double, etc. One distinction between the object types and native types is that objects types are defined and allocated. Another distinction is that, in Visual Basic, most mathematical operations on native types involve the use of symbolic operators, e.g., '+', '−', '*', '/'. The programming interface for site-aware objects, however, defines methods corresponding to these operators.

More specifically, using the Visual Basic programming language, it is possible to define operations (e.g., mathematical, logical, etc.) that can be performed on the site-aware objects. These operations correspond to native Visual Basic operations but are defined using code. This is necessary because site-aware objects have a different structure than native Visual Basic variables. By way of example, an addition operation of $$y=x+0.1$$

may be performed on Visual Basic native variables "y" and "x" to add 0.1 to "x" and assign the resulting value to "y". A similar operation may be performed in Visual Basic for the site-aware objects "X" and "Y", but not using the mathematical operator "+". Instead, a function "add" may be defined in Visual Basic for use with site-aware objects. Using this function, it is possible to add a value of 0.1 to each data entry (for a site) in site-aware object "X" and to assign those values to corresponding entries in "Y", as follows $$Y=X.\text{add}(0.1)$$

Other operations may be defined using different functions. Using such functions, site-aware objects can be treated by Visual Basic (or other programming language) as a single native data element is treated in Visual Basic (or other programming language). This functionality promotes site transparency, since it allows site-aware objects to be treated, essentially, as Visual Basic objects, thereby allowing programmers to focus on process flow instead of trying to account for the multiple sites in ATE 12.

The foregoing operation definitions are not a limitation inherent to site-aware objects. Rather, the need for operation definition is a characteristic of the Visual Basic programming environment, which does not support operator overloading. In a different programming environment, site-aware objects may have symbolic operator support.

Figure 3:
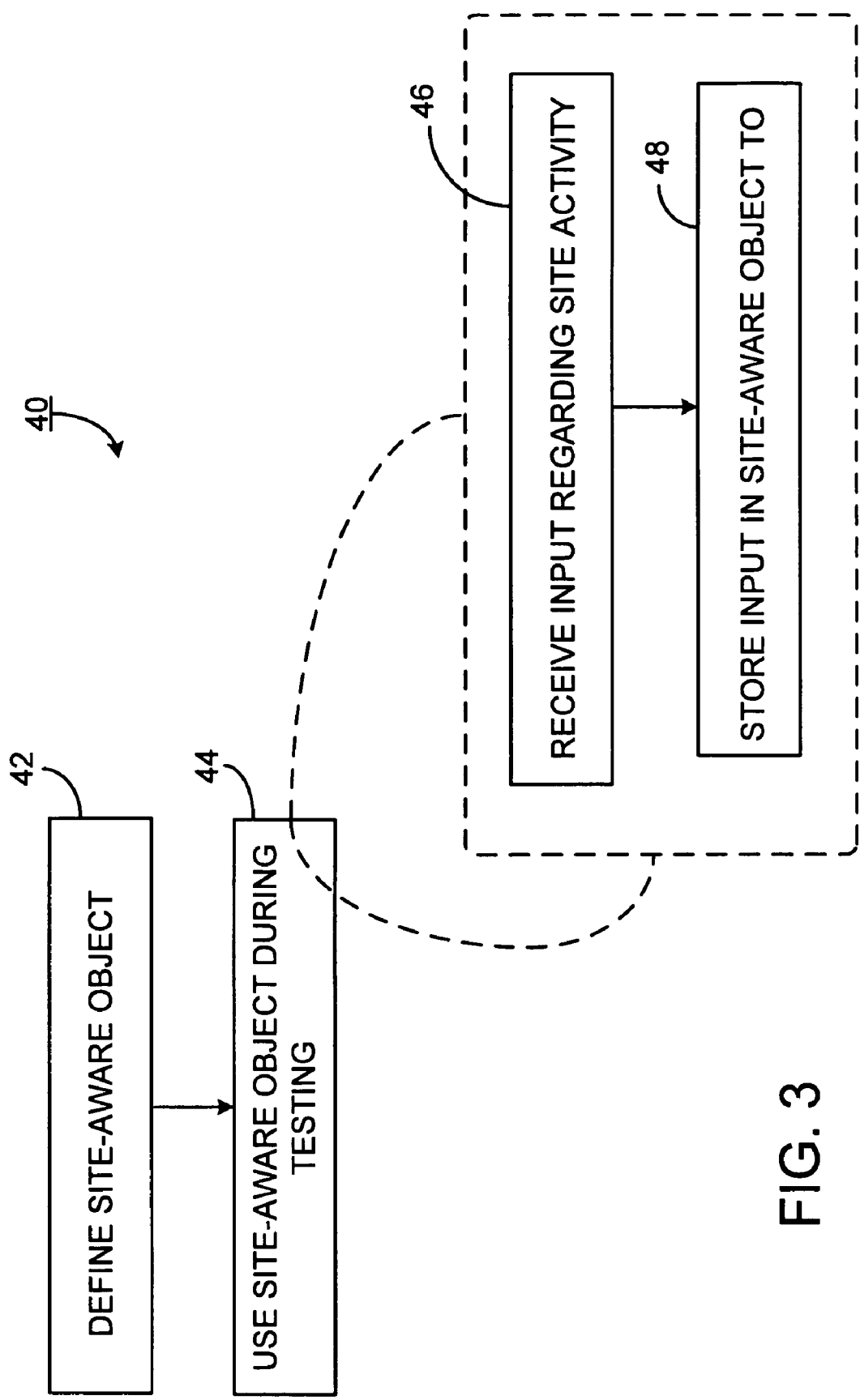
FIG. 3 is a flowchart of a process for using a site-aware object during testing.

FIG. 3 shows a process 40 for using ATE 12 with site-aware objects. Process 40 defines (42) a site-aware object for use with sites 16a to 16d. The site-aware object may be defined in accordance with user inputs. The site-aware object is used (44) by ATE 12 during testing of DUTs in sites 16a to 16d. As described above, the site-aware object communicates with the ATE software site management infrastructure 24 to determine which sites are active. In particular, the site-aware object receives (46) an indication that a particular DUT is selected, and stores (48) the indication in the site-aware object.

During testing, the site-aware object may be used for any purpose including, but not limited to, programming the ATE, storing readings from the ATE, recording test results, and processing the readings using the site-aware object, including changing the readings and/or reporting the readings to a testing subsystem.

Referring back to FIG. 1, in this example, at least part of test software 30 and ATE software 20 run asynchronously. To alleviate the problems noted above, and thereby increase the operational speed of test system 10, the logical flow of test software 30 is designed so that it does not require data from ATE 12 until relatively late in the test software logic flow. In this particular implementation, this means is that test software 30 is designed to allow ATE software 20 to process received DUT test data before test software 30 requests such data from the ATE. By allowing the logical flow of test software 30 to delay evaluation of site-aware object(s) from ATE 12, this implementation reduces the chances that test software 30 will have to wait for data from ATE software 20.

To enable the logic flow of test software 30 to support delayed evaluation, site-aware objects in test software 30 are modified to enable the logical flow to continue even though the actual ATE test data is not present. As a result, when the site-aware objects are encountered in the logical flow, they can be processed in the same way as if they did contain the actual ATE test data. The modification to the site-aware objects that enables this operation includes substituting one or more pointers for the actual ATE test data. That is, site-aware objects in test software 30 are instantiated with pointers instead of ATE test data. The pointers may reference locations either on computer 22 or ATE 12 that will eventually contain the test data, although this is not a requirement. The pointers may simply be placeholders that are replaced with actual ATE test data at the appropriate time. In other embodiments, placeholders other than pointers may be used.

When test software 30 encounters a site-aware object, it is thus able to continue processing without requiring actual ATE test data. This reduces the amount that test software 30 queries ATE software 20 for test data, and also gives ATE software 20 more time to obtain and process that test data. As a result, when test software 30 actually does require the test data from ATE software 20, it is more likely that the test data will be readily available, thereby decreasing the amount of time that test software 30 must wait, resulting in a decrease in overall testing time and an increase in testing speed.

Test software 30 and ATE software 20 execute concurrently, meaning that test software 30 can perform whatever operations it requires while ATE software 20 processes data on ATE 12. At some point in its logical flow, test software 30 will require actual ATE test data. At this point, test software 30 obtains such data from ATE software 20. A process 50 for doing this is explained with respect to FIG. 4 below. The left half 52 of process 50 is performed by ATE software 20 and the right half 54 of process 50 is performed by test software 30. It is noted that the illustrated tasks may be allocated differently between the ATE and computer than is shown in FIG. 4.

Figure 4:
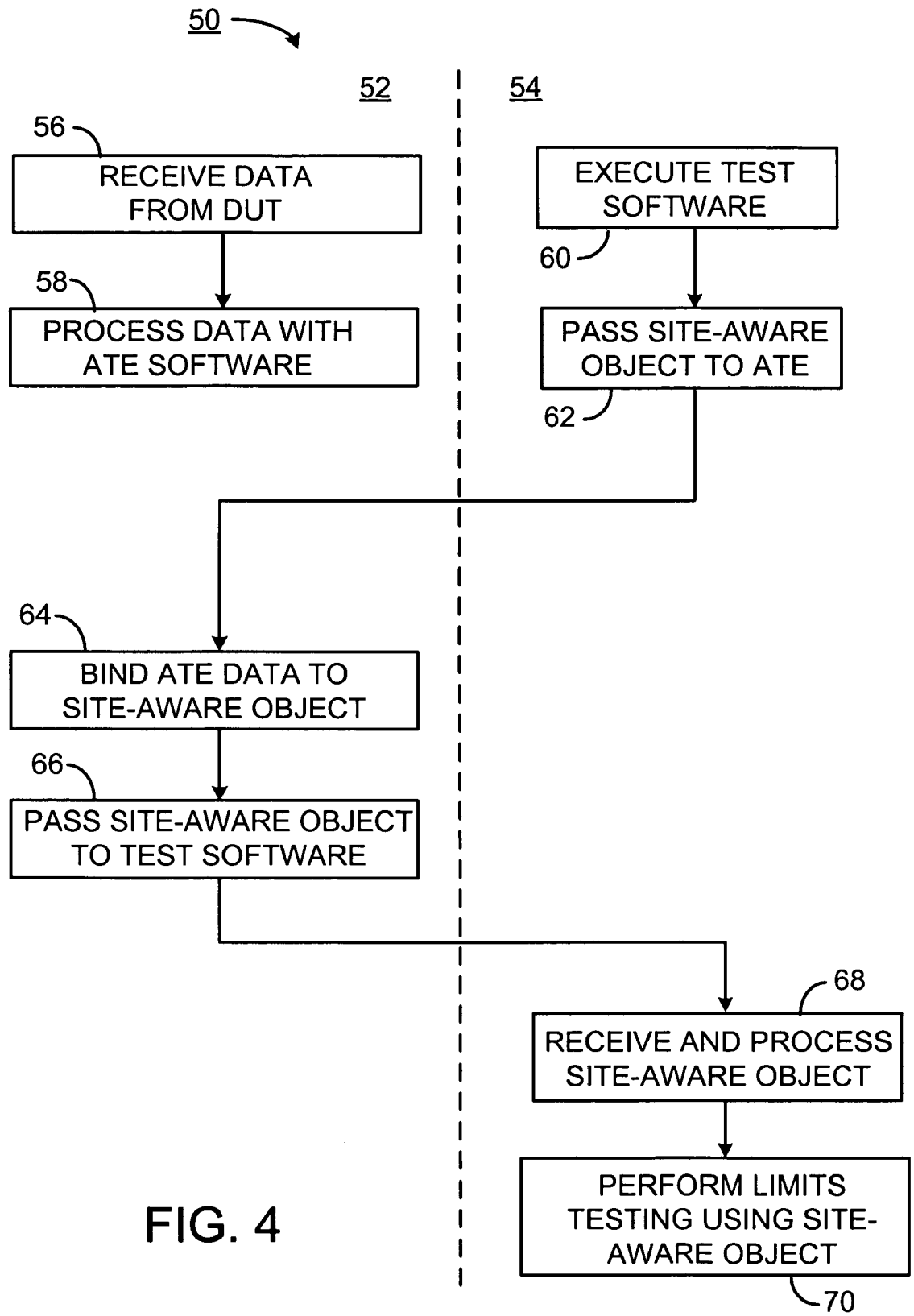
FIG. 4 is a flowchart showing delayed evaluation of site-aware objects.

As shown in FIG. 4, ATE software 20 receives (56) data from one or more DUTs in sites 16a to 16d. The data may be raw test data indicating, e.g., a DUT's response to a stimulus provided via ATE 12. ATE software 20 performs whatever processing (58) is required on this data. Meanwhile, test software 30 executes (60) on computer 22. As noted above site-aware objects in test software 30 that require actual ATE test data are instantiated with pointers in place of that ATE test data. Test software 30 thus continues executing until actual ATE test data is required which, as noted above, should be relatively late in the logical flow of test software 30. At the point in test software 30 where actual ATE test data is required, test software 30 passes (62), to ATE software 20, site-aware object(s) that require the actual ATE test data. ATE software 20 receives (64) those site-aware object(s) and replaces pointer(s) in the site-aware object(s) with ATE test data. In object-oriented programming parlance, ATE software 20 binds the ATE test data to the site-aware objects. The pointer(s) may specify which data is to be included in the site-aware object(s) or another system may be used to identify the appropriate ATE test data. For example, pointers may reference a storage location where processed ATE test data is stored.

ATE software 20 passes (66) the site-aware object(s), with processed ATE test data, back to test software 30. Test software 30 receives (68) the site-aware object(s) and continues execution using the received site-aware object(s). This execution may include evaluating (70) test limits for the ATE test data. Test software 30 is designed to postpone limits testing until relatively late in its logic flow. In this context, limits testing refers to determining whether test data falls inside of, or outside of, an acceptable range, e.g., between a high limit and a low limit. The operation of test program, in particular limits testing, is thus not slowed waiting for ATE test data from ATE 12.

Figure 5:
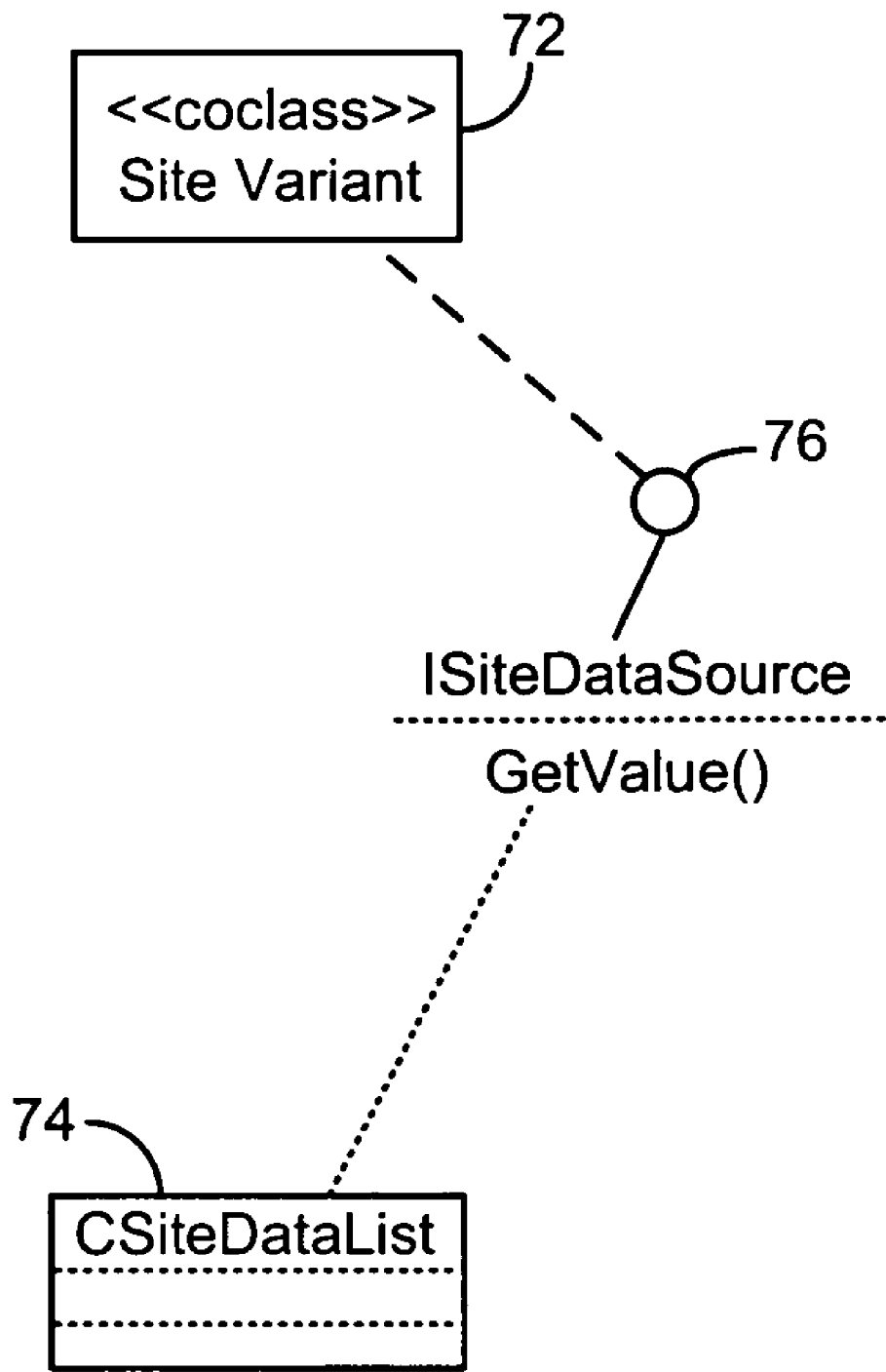
FIG. 5 is a diagram illustrating the data structure of a site-aware object.

As noted above, ATE test data stored in a site-aware object is stored as a data structure within the object. Site-aware objects can be made reusable by tearing-away ATE test data in an object and replacing that data with other data, such as new test data or pointers(s). Tearing-away ATE test data may include copying the existing data structure of a site-aware object to another object in order to preserve its data, and replacing the existing data structure with a different data structure containing different data. This concept is explained with respect to FIG. 5, which depicts a site-aware object 72 (SiteVariant) and its data structure 74 (CSiteDataList). An interface 76 (IsiteDataSource) links the two, and can be used to link site-aware object 72 to a different data structure (not shown in FIG. 5).

An example of using site-aware objects in the manner described above follows. More specifically, consider the following example of test code, which may be part of test software 30, and which is written in Visual Basic.

Dim Result As New Site Variant
Dim ResCopy As New SiteVariant
Call RunDSP("MyDsp", Result)
ResCopy=Result
Call RunDsp("MyDsp2", Result)

In this example, RunDsp is a DSP invocation routine that executes a user-defined routine, MyDsp, returning an output value in site-aware object Result. Result is then assigned to site-aware object ResCopy and reused in an invocation of another user-defined routine, MyDsp2. Thus, ResCopy holds the output from MyDsp and Result holds the output of MyDsp2. Execution of the foregoing code should not interfere with the asynchronous execution of DSP routines on ATE 12, such as ATE software 20. Since the test code does not request a value from any site-aware objects, no actual evaluation need take place.

Other operations, including mathematical manipulation, are permitted in test code 30 without affecting the asynchronous nature of test system 10. For example, the foregoing test code might proceed in its logical flow as follows Result=ResCopy.Add(Result)
Call TestLimits(Result)

In this case, the value of Result holds a sum of the outputs from MyDsp and MyDsp2. The TestLimits execution may request a value or delay a value request. This behavior may depend on test software settings aside from user-written code.

The foregoing test code executes as expected, in part, because of the tearing-off functionality noted above. As noted, tearing-off means that current values of the internal structure of a site-aware are copied and detached. Consider the test code from above.

ResCopy=Result
Call RunDsp("MyDsp2",Result)

The first statement causes ResCopy to refer to the values in site-aware object Result. Result "knows" that another object refers to its values. The second statement causes Result to be assigned a data stream associated with the execution of MyDsp2. Since Result's values are "pinned" by its assignment to ResCopy, Result copies and detaches its original internal data structure before referring to its new value. The code above invokes the following sequence of events. ResCopy creates an object representing an "add" operation. This operator refers to the internal structures of both ResCopy and Result. ResCopy creates a new SiteVariant which refers to an "add" operator. Result "tears-off" its internal structure so that it can hold its new value, namely the SiteVariant previously created.

A routine called TestLimits may refer to Result's internal structure for future evaluation or immediately request values depending on test settings. When a value is requested, the object chain executes the recorded operations to yield a result. The end of the chain is a request to the ATE's DSP for output values of user-defined routines.

The processes and site-aware objects described herein are not limited to use with any particular hardware, software, or programming language; they may find applicability in any computing or processing environment and with any type of machine that is capable of running machine-readable instructions. All or part of the processes and site-aware objects can be implemented in digital electronic circuitry, or in computer hardware, firmware, software, or in combinations thereof.

All or part of the processes and site-aware objects can be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with the processes and site-aware objects can be performed by one or more programmable processors executing one or more computer programs to perform the functions of the processes and site-aware objects. The method steps can also be performed by, and the processes and site-aware objects can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include a processor for executing instructions and one or more storage area devices for storing instructions and data. Generally, a computer will also include, or be operatively coupled to receive data from, or transfer data to, or both, one or more mass storage devices for storing data, e.g., magnetic, magneto-optical disks, or optical disks. Information carriers suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

All or part of the processes and site-aware objects can be implemented in a computing system that includes a back-end component, e.g., as a data server, or that includes a middleware component, e.g., an application server, or that includes a front-end component, e.g., a client computer having a graphical user interface, or any combination of such back-end, middleware, or front-end components. The components of the system can be interconnected by any form or medium of digital data communication, e.g., a communication network. Examples of communication networks include a LAN and a WAN, e.g., the Internet.

Method steps associated with the processes and site-aware objects can be rearranged and/or one or more such steps can be omitted to achieve the same, or similar, results to those described herein.

The processes described herein can be used in the context of a procedural language, rather than with object-oriented programming. For example, site aware objects X, Y, might be defined as follows:

X=Instrument.ReadMeasurement(PinA)
Y=X.Add(0.1)

In a procedural language, such as C, counterparts to X, Y may be implemented using data structures (X, Y below) and external functions (Add( )), as follows:

X=ReadMeasurement(InstrumentID,PinA)
Y=Add(X, 0.1)

One difference is that in a procedural language, X and Y would only contain the data and there would be external functions, such as Add( ), that would perform any processing.

Elements of different embodiments described herein may be combined to form other embodiments not specifically set forth above. Other embodiments not specifically described herein are also within the scope of the following claims.

What is claimed is:

1. A method of testing a device using a system comprised of automatic test equipment (ATE) communicatively coupled to a computer, the method comprising:
   at the ATE:
      receiving data from the device; and
      processing the data to obtain processed data;
   at the computer:
      executing a computer program while the data is being processed at the ATE, the computer program processing an object that contains a pointer;
      passing the object to the ATE;
      receiving the object from the ATE, the pointer in the object being replaced with the processed data; and
      using the object, which includes the processed data, to evaluate the device.

2. The method of claim 1, wherein the ATE receives the object and replaces the pointer in the object with the processed data.

3. The method of claim 1, wherein replacing comprising binding the object to the processed data.

4. The method of claim 1, wherein the computer program does not pass the object to the ATE until the computer program requires the processed data.

5. The method of claim 1, wherein using the object to evaluate the device comprises determining whether the processed data falls within an acceptable range of test limits.

6. The method of claim 1, wherein the pointer points to a storage location associated with the processed data.

7. The method of claim 1, wherein the processed data is stored in a data structure in the object; and the method further comprises:
   copying the data structure to a different object; and
   replacing the data structure with a different data structure.

8. The method of claim 1, wherein the object is for use with the plural sites, the object containing data associated with at least some of the plural sites, the object keeping track of which sites are active.

9. A system of testing a device comprising:
   automatic test equipment (ATE) comprising a first processor, the first processor for executing code to:
      receive data from the device; and
      process the data to obtain processed data; and
   a computer comprising a second processor, the computer being communicatively coupled to the ATE, the second processor for executing code to:
      execute a computer program while the data is being processed at the ATE, the computer program for processing an object that contains a pointer;
      pass the object to the ATE;
      receive the object from the ATE, the pointer in the object being replaced with the processed data; and
      use the object, which includes the processed data, to evaluate the device.

10. The system of claim 9, wherein the first processor is configured to execute code to receive the object and to replace the pointer in the object with the processed data.

11. The system of claim 9, wherein replacing comprising binding the object to the processed data.

12. The system of claim 9, wherein the second processor is configured not to pass the object to the ATE until the computer program requires the processed data.

13. The system of claim 9, wherein using the object to evaluate the device comprises determining whether the processed data falls within an acceptable range of test limits.

14. The system of claim 9, wherein the pointer points to a storage location associated with the processed data.

15. The system of claim 14, wherein the pointer points to a storage location associated with the processed data.

16. The system of claim 9, wherein the processed data is stored in a data structure in the object; and the second processor is configured to execute code to:
   copy the data structure to a different object; and
   replace the data structure with a different data structure.

17. The system of claim 9, wherein the object is for use with the plural sites, the object containing data associated with at least some of the plural sites, the object keeping track of which sites are active.

18. One or more machine-readable media for storing executable instructions, the executable instructions comprising:
   first instructions that are executable on automatic test equipment (ATE) to:
      receive data from a device under test;
      process the data to obtain processed data; and
   second instructions that are executable on a computer that is communicatively coupled to the ATE, the second instructions to:
      execute a computer program while the data is being processed, the computer program for processing an object that contains a pointer;
      replace the pointer in the object with the processed data only after the computer program reaches a point where the computer program requires the processed data; and
      use the object, which includes the processed data, to evaluate the device.

19. The one or more machine-readable media of claim 18, wherein the processed data is stored in a data structure in the object; and the one or more machine-readable media comprise instructions that are executable at the ATE to:
   copy the data structure to a different object; and
   replace the data structure with a different data structure.

20. The one or more machine-readable media of claim 18, wherein using the object to evaluate the device comprises determining whether the processed data falls within an acceptable range of test limits.

* * * * *